(12) United States Patent
Dussinger et al.

(10) Patent No.: US 7,066,240 B2
(45) Date of Patent: Jun. 27, 2006

(54) INTEGRATED CIRCUIT HEAT PIPE HEAT SPREADER WITH THROUGH MOUNTING HOLES

(75) Inventors: Peter M. Dussinger, Lititz, PA (US); Thomas L. Myers, Lititz, PA (US)

(73) Assignee: Thermal Corp, Wilmington, DE (US)

( * ) Notice: Subject to any disclaimer, the term of this patent is extended or adjusted under 35 U.S.C. 154(b) by 751 days.

(21) Appl. No.: 09/852,322

(22) Filed: May 9, 2001

(65) Prior Publication Data

US 2002/0023742 A1 Feb. 28, 2002

Related U.S. Application Data

(63) Continuation of application No. 09/310,397, filed on May 12, 1999, now Pat. No. 6,302,192.

(51) Int. Cl.
F28D 15/00 (2006.01)

(52) U.S. Cl. ............... 165/104.26; 165/104.33; 361/700; 257/715

(58) Field of Classification Search ............... 165/80.2, 165/80.3, 104.21, 104.26, 104.33, 185, 46; 361/700; 257/714, 715; 174/15.2, 16.3
See application file for complete search history.

(56) References Cited

U.S. PATENT DOCUMENTS

| 3,209,062 A | 9/1965 | Scholz | 174/15 |
| 3,490,718 A | 1/1970 | Vary | 244/1 |
| 3,519,067 A | 7/1970 | Schmidt | 165/32 |
| 3,543,841 A | 12/1970 | Eastman et al. | 165/80 |
| 3,680,189 A | 8/1972 | Noren | 29/157.3 |
| 3,827,480 A | 8/1974 | Gammel et al. | 165/105 |
| 3,834,457 A | 9/1974 | Madsen | 165/105 |
| 4,046,190 A | 9/1977 | Marcus et al. | 165/105 |
| 4,047,198 A | 9/1977 | Sekhon et al. | 357/82 |
| 4,118,756 A | 10/1978 | Nelson et al. | 361/385 |
| 4,145,708 A | 3/1979 | Ferro et al. | 357/82 |

(Continued)

FOREIGN PATENT DOCUMENTS

| DE | 1284506 | 12/1968 | | |
| DE | 1402509 | 8/1975 | | |
| FR | 2579371 | 9/1986 | | |
| JP | 52 034 673 | 3/1977 | | |
| JP | 54-154277 | 5/1979 | | |
| SU | 407160 | 4/1974 | | |
| SU | 589531 | 1/1978 | | |
| SU | 987357 | 1/1983 | | |
| SU | 1261029 | * | 9/1986 | 165/104.26 |
| SU | 1476-297 | 4/1989 | | |

OTHER PUBLICATIONS

Fujikura Ltd, Drawing of Lobster Heat Pipe, Part No. FHP–47201, Sep. 25, 1995.

(Continued)

*Primary Examiner*—Ljiljana Ciric
(74) *Attorney, Agent, or Firm*—Duane Morris LLP

(57) ABSTRACT

The apparatus is a heat pipe with superior heat transfer between the heat pipe and the heat source and heat sink. The heat pipe is held tightly against the heat source by mounting holes which penetrate the structure of the heat pipe but are sealed off from the vapor chamber because they each are located within a sealed structure such as a pillar or the solid layers of the casing surrounding the vapor chamber. Another feature of the heat pipe is the use of more highly heat conductive material for only that part of the wick in the region which contacts the heat source, so that there is superior heat conductivity in that region.

14 Claims, 3 Drawing Sheets

U.S. PATENT DOCUMENTS

| | | | | |
|---|---|---|---|---|
| 4,461,343 | A | | 7/1984 | Token et al. ............ 165/104.26 |
| 4,793,405 | A | * | 12/1988 | Diggelmann et al. ... 165/104.33 |
| 5,000,256 | A | | 3/1991 | Tousignant ................... 165/46 |
| 5,052,472 | A | | 10/1991 | Takahashi et al. .............. 165/1 |
| 5,305,184 | A | | 4/1994 | Andresen et al. ............ 361/699 |
| 5,305,185 | A | | 4/1994 | Samarov et al. ............. 361/704 |
| 5,323,292 | A | | 6/1994 | Brzezinski ................... 361/689 |
| 5,386,143 | A | | 1/1995 | Fitch ........................... 257/715 |
| 5,390,077 | A | | 2/1995 | Paterson ..................... 361/700 |
| 5,427,174 | A | | 6/1995 | Lomolino, Sr. et al. ......... 165/1 |
| 5,465,782 | A | | 11/1995 | Sun et al. ............... 165/104.26 |
| 5,513,070 | A | | 4/1996 | Xie et al. .................... 361/700 |
| 5,642,776 | A | | 7/1997 | Meyer, IV et al. ...... 165/104.26 |
| 5,694,295 | A | | 12/1997 | Mochizuki et al. .......... 361/699 |
| 5,754,401 | A | | 5/1998 | Saneinejad et al. .......... 361/705 |
| 5,784,256 | A | | 7/1998 | Nakamura et al. ........... 361/699 |
| 5,880,524 | A | | 3/1999 | Xie ............................. 257/704 |
| 6,082,443 | A | | 7/2000 | Yamamoto et al. ..... 165/104.26 |
| 6,212,074 | B1 | | 4/2001 | Gonsalves et al. ........... 361/717 |
| 6,256,201 | B1 | | 7/2001 | Ikeda et al. .................. 361/704 |
| 6,263,959 | B1 | | 7/2001 | Ikeda et al. ............. 165/104.26 |
| 6,269,866 | B1 | | 8/2001 | Yamamoto et al. ..... 165/104.26 |
| 6,317,322 | B1 | | 11/2001 | Ueki et al. ................... 361/700 |

OTHER PUBLICATIONS

Fujikura Ltd, Report No. FHP-95-185, Lobster Heat Pipe for Cooling Alpha, Oct. 25, 1995, pp. 1-3.

Fujikura America, Inc., Heat Pipe Quotation, Oct. 31, 1995.

Low-Cost Cooling Package Article, by C. Nuccio, IBM Technical Disclosure Bulletin, vol. 18, No. 11, Apr. 1976, pp. 3761-3762.

Conduction Cooled Heat Plate For Modular Circuit Package Article, by R.J. Dombrowskas and P.O. Patch, IBM Technical Disclosure Bulletin, vol. 13, No. 2, Jul. 1970, p. 442.

Engineering Drawing No. FHP-0430-01 for Heat Sink Assembly by Sun Microsystems dated Apr. 30, 2001.

Facsimile Cover Sheet from Sun Microsystems regarding drawing CH090W-971119 (980204) dated Feb. 4, 1998.

Engineering Drawing No. CH090W-971119 dated Feb. 4, 1998 (see 980204 on drawing).

Engineering Drawing dated Feb. 26, 1998.

Auslegeschrift DE 1 284 506, "Supporting Plate for Temperature-Sensitive Electric Components," Translation from German, ICA Translation Number 32 596c.*

* cited by examiner

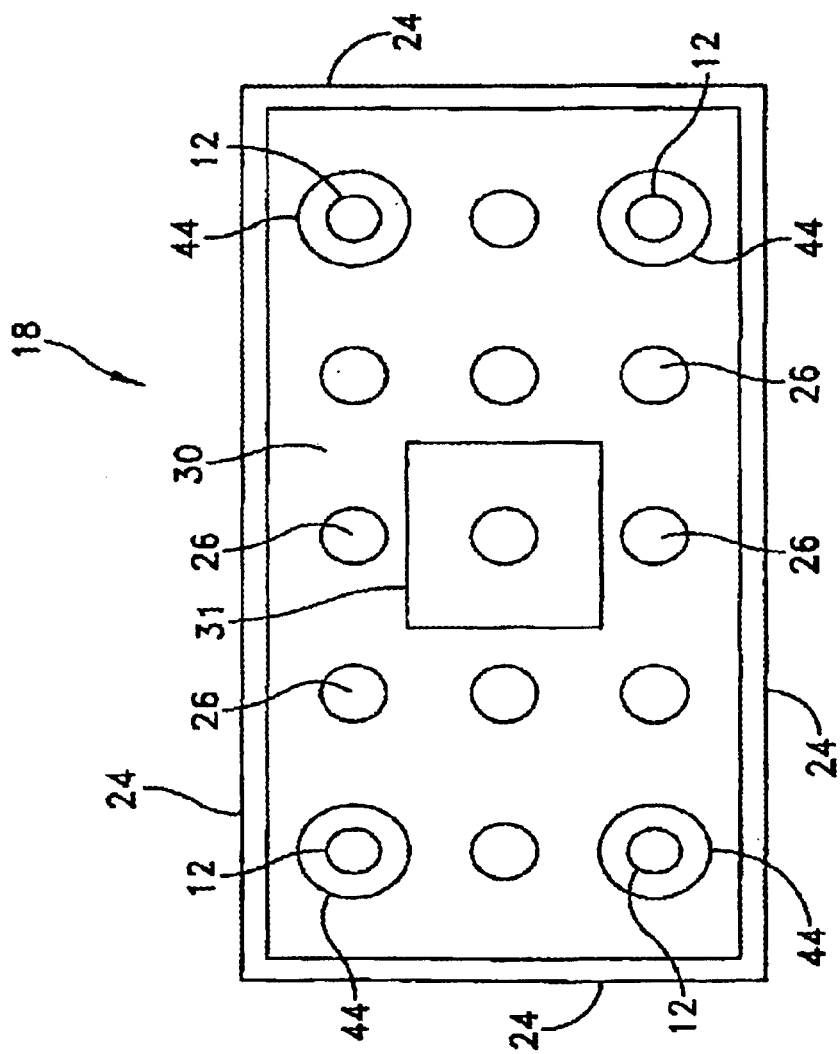

INTEGRATED CIRCUIT HEAT PIPE HEAT SPREADER WITH THROUGH MOUNTING HOLES

This application is a continuation application of U.S. application Ser. No. 09/310,397, filed on May 12, 1999, now U.S. Pat. No. 6,302,192.

BACKGROUND OF THE INVENTION

This invention relates generally to active solid state devices, and more specifically to a heat pipe for cooling an integrated circuit chip, with the heat pipe designed to be held in direct contact with the integrated circuit.

As integrated circuit chips decrease in size and increase in power, the required heat sinks and heat spreaders have grown to be larger than the chips. Heat sinks are most effective when there is a uniform heat flux applied over the entire heat input surface. When a heat sink with a large heat input surface is attached to a heat source of much smaller contact area, there is significant resistance to the flow of heat along the heat input surface of the heat sink to the other portions of the heat sink surface which are not in direct contact with the contact area of the integrated circuit chip. Higher power and smaller heat sources, or heat sources which are off center from the heat sink, increase the resistance to heat flow to the balance of the heat sink. This phenomenon can cause great differences in the effectiveness of heat transfer from various parts of a heat sink. The effect of this unbalanced heat transfer is reduced performance of the integrated circuit chip and decreased reliability due to high operating temperatures.

The brute force approach to overcoming the resistance to heat flow within heat sinks which are larger than the device being cooled is to increase the size of the heat sink, increase the thickness of the heat sink surface which contacts the device to be cooled, increase the air flow which cools the heat sink, or reduce the temperature of the cooling air. However, these approaches increase weight, noise, system complexity, and expense.

It would be a great advantage to have a simple, light weight heat sink for an integrated circuit chip which includes an essentially isothermal surface even though only a part of the surface is in contact with the chip, and also includes a simple means for assuring intimate contact with the integrated circuit chip to provide good heat transfer between the chip and the heat sink.

SUMMARY OF THE INVENTION

The present invention is an inexpensive heat pipe heat spreader for integrated circuit chips which is of simple, light weight construction. It is easily manufactured, requires little additional space, and provides additional surface area for cooling the integrated circuit and for attachment to heat transfer devices for moving the heat away from the integrated circuit chip to a location from which the heat can be more easily disposed of. Furthermore, the heat pipe heat spreader is constructed to assure precise flatness and to maximize heat transfer from the heat source and to the heat sink, and has holes through its body to facilitate mounting.

The heat spreader of the present invention is a heat pipe which requires no significant modification of the circuit board or socket because it is held in intimate contact with the integrated circuit chip by conventional screws attached to the integrated circuit mounting board. This means that the invention uses a very minimum number of simple parts. Furthermore, the same screws which hold the heat spreader against the chip can also be used to clamp a finned heat sink to the opposite surface of the heat spreader.

The internal structure of the heat pipe is an evacuated vapor chamber with a limited amount of liquid and includes a pattern of spacers extending between and contacting the two plates or any other boundary structure forming the vapor chamber. The spacers prevent the plates from bowing inward, and therefore maintain the vital flat surface for contact with the integrated circuit chip. These spacers can be solid columns, embossed depressions formed in one of the plates, or a mixture of the two. Porous capillary wick material also covers the inside surfaces of the heat pipe and has a substantial thickness surrounding the surfaces of the spacers within the heat pipe, thus forming pillars of porous wick surrounding the supporting spacers. The wick material therefore spans the space between the plates in multiple locations.

The spacers thus serve important purposes. They support the flat plates and prevent them from deflecting inward and distorting the plates to deform the flat surfaces which are required for good heat transfer. The spacers also serve as critical support for the portions of the capillary wick which span the internal space between the plates. The capillary wick pillars which span the space between the plates provide a gravity independent characteristic to the heat spreader, and the spacers around which the wick pillars are located assure that the capillary wick is not subjected to destructive compression forces.

The spacers also make it possible to provide holes into and through the vapor chamber, an apparent inconsistency since a heat pipe vacuum chamber is supposed to be vacuum tight. This is accomplished by bonding the spacers, if they are solid, to both plates of the heat pipe, or, if they are embossed in one plate, bonding the portions of the depressions which contact the opposite plate to that opposite plate. With the spacer bonded to one or both plates, a through hole can be formed within the spacer and it has no effect on the vacuum integrity of the heat pipe vapor chamber, from which the hole is completely isolated.

An alternate embodiment of the invention provides the same provision for mounting the heat pipe heat spreader with simple screws even when the heat pipe is constructed without internal spacers. This embodiment forms the through holes in the solid boundary structure around the outside edges of the two plates. This region of the heat pipe is by its basic function already sealed off from the vapor chamber by the bond between the two plates, and the only additional requirement for forming a through hole within it is that the width of the bonded region be larger than the diameter of the hole. Clearly, with the holes located in the peripheral lips, the heat pipe boundary structure can be any shape.

Another alternate embodiment of the invention provides for improved heat transfer between the integrated circuit chip and the heat pipe heat spreader. This is accomplished by using a different capillary wick material within the heat pipe at the location which is directly in contact with the chip. Instead of using the same sintered copper powder wick which is used throughout the rest of the heat pipe, the part of the wick which is on the region of the heat pipe surface which is in contact with the chip is constructed of higher thermal conductivity sintered powder. Such powder can be silver, diamond, or many other materials well known in the art. This provides for significantly better heat transfer in the most critical heat transfer area, right at the integrated circuit chip.

The present invention thereby provides a heat pipe with superior heat transfer characteristics, and the simplest of all mounting devices, just several standard screws.

BRIEF DESCRIPTION OF THE DRAWINGS

FIG. 3 is a plan view of an internal surface of the contact plate of the preferred embodiment of the invention showing the region of the capillary wick constructed of sintered higher heat conductivity powder.

DETAILED DESCRIPTION OF THE INVENTION

Figure 1:
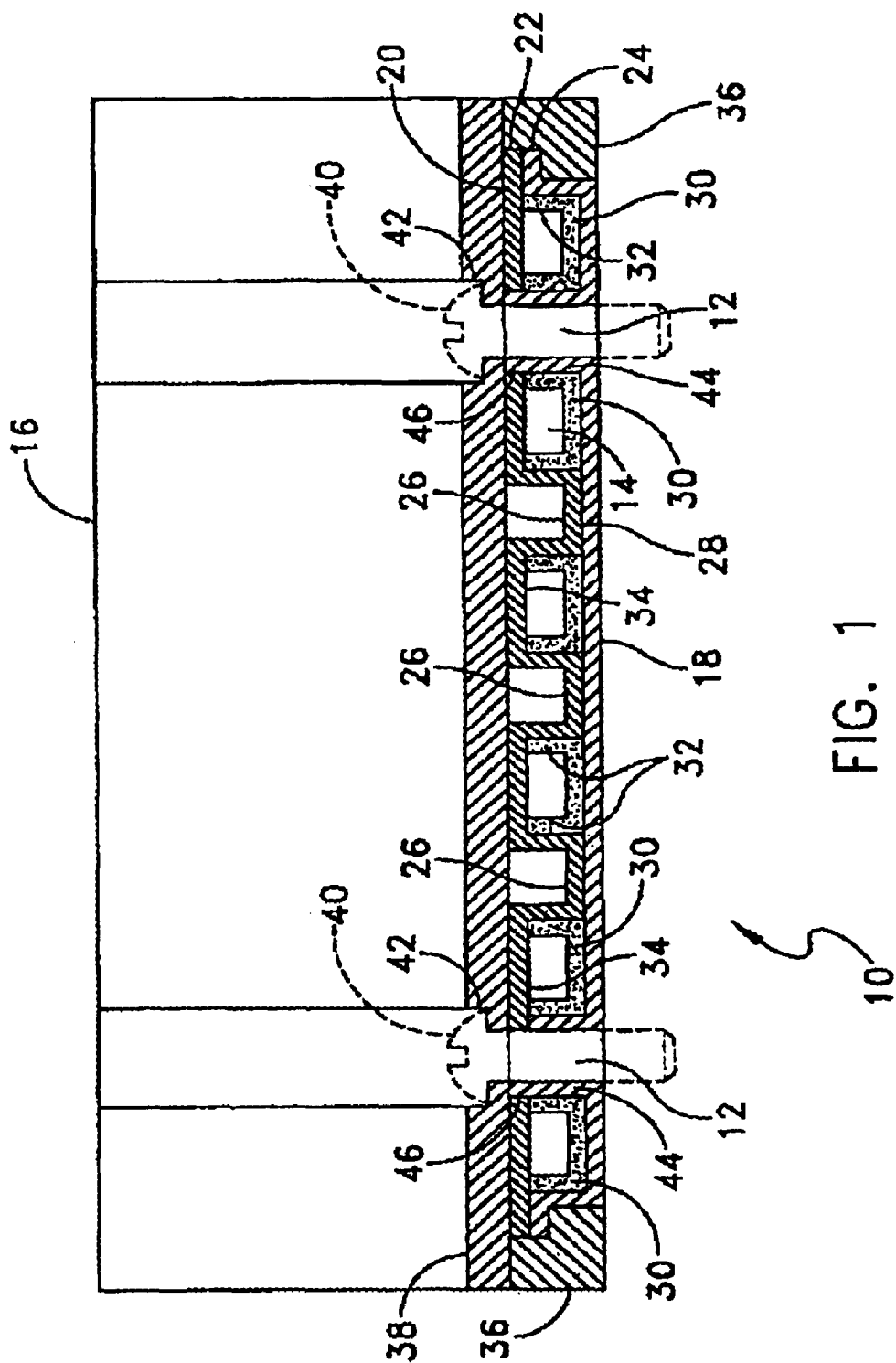
FIG. 1 is a cross section view of the preferred embodiment of the heat pipe of the invention with through holes through its vapor chamber and in contact with a finned heat sink.

FIG. 1 is a cross section view of the preferred embodiment of a flat plate heat pipe 10 of the invention with through holes 12 through its vapor chamber 14 and in contact with finned heat sink 16.

Heat pipe 10 is constructed by forming a boundary structure by sealing together two formed plates, contact plate 18 and cover plate 20. Contact plate 18 and cover plate 20 are sealed together at their peripheral lips 22 and 24 by conventional means, such as soldering or brazing, to form heat pipe 10. Heat pipe 10 is then evacuated to remove all non-condensible gases and a suitable quantity of heat transfer fluid is placed within it. This is the conventional method of constructing a heat pipe, and is well understood in the art of heat pipes.

The interior of heat pipe 10 is, however, constructed unconventionally. While contact plate 18 is essentially flat with the exception of peripheral lip 24, cover plate 20 includes multiple depressions 26. Depressions 26 are formed and dimensioned so that, when contact plate 18 and cover plate 20 are joined, the flat portions of depressions 26 are in contact with inner surface 28 of contact plate 18. Depressions 26 thereby assure that the spacing between contact plate 18 and cover plate 20 will be maintained even though pressure differentials between the inside volume of heat pipe 10 and the surrounding environment might otherwise cause the plates to deflect toward each other.

Heat pipe 10 also includes internal sintered metal capillary wick 30 which covers the entire inside surface of contact plate 18. As is well understood in the art of heat pipes, a capillary wick provides the mechanism by which liquid condensed at the cooler condenser of a heat pipe is transported back to the hotter evaporator where it is evaporated. The vapor produced at the evaporator then moves to the condenser where it again condenses. The two changes of state, evaporation at the hotter locale and condensation at the cooler site, are what transport heat from the evaporator to the condenser.

In the present invention, heat pipe 10 also has capillary wick pillars 32 which bridge the space between contact plate 18 and cover plate 20. Pillars 32 thereby interconnect cover plate 20 and contact plate 18 with continuous capillary wick. This geometry assures that, even if heat pipe 10 is oriented so that cover plate 20 is lower than contact plate 18, liquid condensed upon inner surface 34 of cover plate 20 will still be in contact with capillary pillars 32. The liquid will therefore be moved back to inner surface 28 which functions as the evaporator because it is in contact with a heat generating integrated circuit (not shown). Capillary pillars 32 are wrapped around and supported by depressions 26, which prevents the structurally weaker capillary pillars 32 from suffering any damage.

FIG. 1 also shows frame 36 which is typically used to surround and protect heat pipe 10. Frame 34 completely surrounds heat pipe 10 and contacts lip 24 of contact plate 18. When heat pipe 10 is used to cool an integrated circuit chip (not shown) which is held against contact plate 18, cover plate 20 is held in intimate contact with fin plate 38, to which fins 16 are connected. The entire assembly of heat pipe 10, frame 34, and fin plate 38 is held together and contact plate 18 is held against an integrated circuit chip by conventional screws 40, shown in dashed lines, which are placed in holes 42 in fin plate 38 and through holes 12 in heat pipe 10, and are threaded into the mounting plate (not shown) for the integrated circuit chip.

Holes 12 penetrate heat pipe 10 without destroying its vacuum integrity because of their unique location. Holes 12 are located within sealed structures such as solid columns 44, and since columns 44 are bonded to cover plate 20 at locations 46, holes 12 passing through the interior of columns 44 have no affect on the interior of heat pipe 10.

The preferred embodiment of the invention has been constructed as heat pipe 10 as shown in FIG. 1. This heat pipe is approximately 3.0 inches by 3.5 inches with a total thickness of 0.200 inch. Cover plate 20 and contact plate 18 are constructed of OFHC copper 0.035 inch thick, and depressions 26 span the 0.100 inch height of the internal volume of heat pipe 10. The flat portions of depressions 26 are 0.060 inch in diameter. Capillary wick 30 is constructed of sintered copper powder and averages 0.040 inch thick. Columns 44 have a 0.250 inch outer diameter, and holes 12 are 0.210 in diameter.

Figure 2:
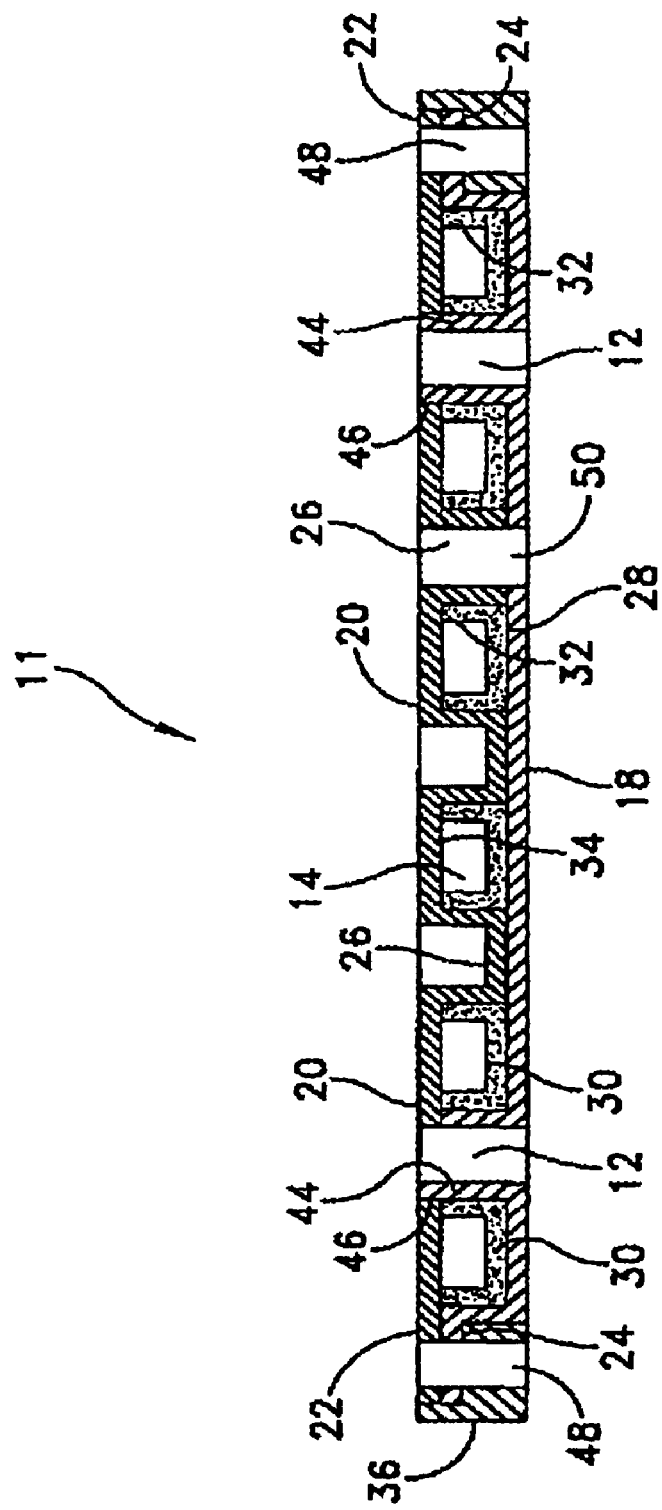
FIG. 2 is a cross section view of an alternate embodiment of the heat pipe of the invention with through holes in the peripheral lips and in a depression in one plate.

FIG. 2 is a cross section view of an alternate embodiment of the flat plate heat pipe 11 of the invention with through holes 48 located within peripheral lips 22 and 24 of the heat pipe and hole 50 shown in another sealed structure, one of the depressions 26. The only requirement for forming hole 50 within a depression 26 is that the bottom of depression 26 must be bonded to inner surface 28 of contact plate 18 to prevent loss of vacuum within the heat pipe. Of course, the region of the peripheral edges is also a sealed structure since bonding between lips 22 and 24 is inherent because heat pipe 11 must be sealed at its edges to isolate the interior from the outside atmosphere.

The only differences between heat pipe 11 of FIG. 2 and heat pipe 10 of FIG. 1 are that finned heat sink 16 is not shown in FIG. 2, lips 22 and 24 are slightly longer in FIG. 2 to accommodate holes 48, and hole 50 is shown. In fact, through holes 12 shown in FIG. 1 are also included in FIG. 2. Although it is unlikely that holes 12, holes 48, and hole 50 would be used in the same assembly, manufacturing economies may make it desirable to produce all the holes in every heat pipe so that the same heat pipe heat spreader can be used with different configurations of finned heat sinks. The unused sets of holes have no effect on the operation or benefits of the invention.

FIG. 3 is a plan view of the internal surface of the contact plate 18 of heat pipe 10 of the invention showing region 31 of capillary wick 30. Region 31 is constructed of sintered silver powder. While the balance of capillary wick 30 is conventional sintered metal such as copper, region 31 of capillary wick 30, which is on the opposite surface of contact plate 18 from the integrated circuit chip (not shown), is formed of powdered silver. The higher thermal conductivity of silver yields significantly better heat conduction through region 31 of the wick 30, and thereby reduces the temperature difference between the integrated circuit chip and the vapor within heat pipe 10. This reduction of temperature difference directly affects the operation of heat pipe 10, and essentially results in a similar reduction in the operating temperature of the chip.

The invention thereby furnishes an efficient means for cooling an integrated circuit and does so without the need for larger heat spreaders which not only add weight but also do not transfer heat away from the integrated circuit as efficiently as does the heat pipe of the invention.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims. For example, through holes could also penetrate heat pipe boundary structures with curved surfaces or heat pipe boundary structures with offset planes which create several different levels for contact with heat sources or heat sinks.

What is claimed as new and for which Letters Patent of the United States are desired to be secured is:

1. A heat pipe for spreading heat comprising:
    a boundary structure including spaced-apart first and second plates that define an enclosed vapor chamber;
    at least one depression formed in said first plate which projects into said vapor chamber and is sealingly bonded to said second plate so as to form a bonded region;
    an opening defined through said bonded region wherein the perimeter of said opening is defined within a portion of said bonded region such that said opening is isolated from said vapor chamber; and
    at least one depression formed in said second plate which projects into said vapor chamber and is sealingly bonded to said first plate.

2. A heat pipe for spreading heat according to claim 1 comprising at least one spacer positioned within said vapor chamber and extending between and contacting said first and second plates.

3. A heat pipe for spreading heat according to claim 1 wherein said spaced-apart first and second plates include confronting interior surfaces; and
    a wick positioned upon said confronting interior surfaces including that portion of the interior surface of said first plate that forms a surface of said depression within said vapor chamber.

4. A heat pipe for spreading heat according to claim 1 wherein said wick is constructed with at least two separate sections of different materials, with one section being located on said first plate interior surface and being formed of a material with higher heat conductivity than sections located on said second plate interior surface.

5. A heat pipe for spreading heat according to claim 1 wherein said depression comprises an annular outer surface that is brazed to a corresponding annular edge surface in said second plate.

6. A heat pipe for spreading heat according to claim 1 wherein said first and second plates each include a peripheral lip located at an edge of said boundary structure at which said peripheral lip of said first plate is sealingly bonded to said peripheral lip of said second plate.

7. A heat pipe for spreading heat according to claim 1 wherein said at least one depression formed in said second plate comprises a flat portion that is in contact with an inner surface of said first plate.

8. A heat pipe for spreading heat according to claim 1 wherein said spaced-apart first and second plates include confronting interior surfaces; and
    a wick positioned upon said confronting interior surfaces including that portion of the interior surface of said first plate that forms a surface of said depression within said vapor chamber.

9. A heat pipe for spreading heat comprising:
    a boundary structure including spaced-apart first and second plates that define an enclosed vapor chamber;
    at least one hollow column having an exterior surface positioned within said vapor chamber with a first portion of said exterior surface sealingly bonded to at least one of said first and second plates, and having an open first end that opens through said first plate and an open second end that opens through said second plate so as to form at least one mounting hole that is isolated from said vapor chamber.

10. A heat pipe for spreading heat according to claim 9 wherein said spaced-apart first and second plates include confronting interior surfaces; and
    a wick positioned upon said confronting interior surfaces of said first and second plates and having a second potion of said exterior surface of said at least one hollow column disposed within said vapor chamber.

11. A heat pipe for spreading heat comprising:
    a boundary structure including a first plate and a second plate arranged in spaced apart relation, each of said plates including interior confronting surfaces and a peripheral lip located at an edge of said boundary structure at which said peripheral lip of said first plate is sealingly bonded to said peripheral lip of said second plate so as to define an enclosed vapor chamber;
    at least one depression formed in said first plate which projects into said vapor chamber, is spaced from said peripheral lip of said first plate, and is sealingly bonded to said second plate so as to form a bonded region;
    an opening defined through said first plate depression and said second plate wherein said depression comprises an annular outer surface that is sealingly bonded to a corresponding annular edge surface in said second plate and further wherein the perimeter of said opening is defined within a portion of said bonded region such that said opening is isolated from said vapor chamber;
    at least one spacer extending between and contacting said first and second plates; and
    a wick positioned upon said confronting interior surfaces including that portion of the interior surface of said first plate that forms a surface of said depression within said vapor chamber.

12. A heat pipe for spreading heat comprising:
    a first plate having a circumferential edge lip bounding an inner surface and at least one hollow column that is integral with said first plate and which projects outwardly relative to said inner surface;
    a second plate arranged in spaced apart confronting relation to said first plate and including a circumferential edge lip bounding an inner surface and at least one opening through said second plate, said edge lips of said first and second plates being sealingly bonded together so as to define a vapor chamber; wherein said at least one hollow column being sealingly bonded at one end to said second plate so as to coaxially align said at least one hollow column with said at least one opening in said second plate thereby to form a mounting hole that extends through said first plate and said second plate and is isolated from said vapor chamber.

13. A heat pipe for spreading heat comprising:

a first plate having a circumferential edge lip bounding an inner surface and at least one depression which projects outwardly relative to said inner surface;

a second plate arranged in spaced apart confronting relation to said first plate and including a circumferential edge lip bounding an inner surface and at least one opening through said second plate, said edge lips of said first and second plates being sealingly bonded together so as to define a vapor chamber; wherein said at least one depression has an open ended tubular cross-section and an outer surface, a portion of which outer surface is sealingly bonded to said second plate so as to coaxially align said at least one depression with said at least one opening in said second plate thereby to form a mounting hole that extends through said first plate depression and said second plate and is isolated from said vapor chamber.

14. A heat pipe for spreading heat comprising:

a first plate having a circumferential edge lip bounding an inner surface and at least one depression which projects outwardly relative to said inner surface;

a second plate arranged in spaced apart confronting relation to said first plate and including (i) a circumferential edge lip bounding an inner surface, (ii) at least one depression which projects into said vapor chamber and that is sealingly bonded to said inner surface of said first plate, and (iii) at least one opening through said second plate, said edge lips of said first and second plates being sealingly bonded together so as to define a vapor chamber; wherein said at least one depression in said first plate has a tubular cross-section that opens at a first end and a second end and is sealingly bonded to said second plate at said second end so as to coaxially align said at least one first plate depression with said at least one opening in said second plate thereby to form a mounting hole that extends through said first plate depression and said second plate and is isolated from said vapor chamber.

* * * * *